(12) United States Patent
Bessho et al.

(10) Patent No.: US 8,867,266 B2
(45) Date of Patent: Oct. 21, 2014

(54) METHOD FOR DRIVING STORAGE ELEMENT AND STORAGE DEVICE

(75) Inventors: Kazuhiro Bessho, Kanagawa (JP); Masanori Hosomi, Tokyo (JP); Hiroyuki Ohmori, Kanagawa (JP); Yutaka Higo, Kanagawa (JP); Kazutaka Yamane, Kanagawa (JP); Hiroyuki Uchida, Kanagawa (JP)

(73) Assignee: Sony Corporation, Tokyo (JP)

( * ) Notice: Subject to any disclaimer, the term of this patent is extended or adjusted under 35 U.S.C. 154(b) by 393 days.

(21) Appl. No.: 13/104,693

(22) Filed: May 10, 2011

(65) Prior Publication Data

US 2011/0310663 A1    Dec. 22, 2011

(30) Foreign Application Priority Data

Jun. 18, 2010    (JP) ................................ 2010-139371

(51) Int. Cl.
*G11C 11/15*    (2006.01)
*G11C 11/16*    (2006.01)

(52) U.S. Cl.
CPC ..................................... *G11C 11/16* (2013.01)
USPC ............ 365/173; 365/148; 365/158; 365/171

(58) Field of Classification Search
USPC .................................. 365/148, 158, 171, 173
See application file for complete search history.

(56) References Cited

U.S. PATENT DOCUMENTS

| 7,171,096 B2 * | 1/2007 | Zayets ........................... 385/131 |
| 2007/0030728 A1 * | 2/2007 | Kent et al. ..................... 365/171 |
| 2009/0168501 A1 * | 7/2009 | Ito ................................... 365/158 |
| 2009/0257274 A1 * | 10/2009 | Itagaki et al. .................. 365/158 |

OTHER PUBLICATIONS

Shinsuke Nakano et al.; Time Evolution of Resistance Drift of Magnetic Tunnel Junctions with Ultrthin AlOx Films; ECS Transactions, 19(2) 711-716; 2009; 10.1149/1.3122126; The Electrochemical Society.
Pon S Ku and Young Chung; Resistance Drift of Aluminum Oxide Magnetic Tunnel Junction Devices; IEEE 06CH37728; 44th Annual International Reliability Physics Symposium; San Jose; 2006.

* cited by examiner

*Primary Examiner* — Tha-O H Bui
(74) *Attorney, Agent, or Firm* — Sony Corporation

(57) ABSTRACT

Disclosed herein is a method for driving a storage element that has a plurality of magnetic layers and performs recording by utilizing spin torque magnetization reversal, the method including applying a pulse voltage having reverse polarity of polarity of a recording pulse voltage in application of the recording pulse voltage to the storage element.

13 Claims, 10 Drawing Sheets

METHOD FOR DRIVING STORAGE ELEMENT AND STORAGE DEVICE

BACKGROUND

The present disclosure relates to a method for driving a storage element that has plural magnetic layers and performs recording by utilizing spin torque magnetization reversal, and a storage device.

Along with dramatic development of various kinds of information apparatus ranging from mobile terminals to high-capacity servers, further enhancement in the performance, such as increases in the degree of integration and the speed and power consumption reduction, is pursued also regarding elements such as memory and logic that configure the information apparatus. In particular, the advance of the semiconductor non-volatile memory is significant and the spread of the flash memory as a large-size file memory is progressing at such a rapid pace as to drive out the hard disc drive. On the other hand, in anticipation of expansion into the code storage and the working memory, development of ferroelectric random access memory (FeRAM), magnetic random access memory (MRAM), phase-change random access memory (PCRAM), etc. is being advanced to replace NOR flash memory, DRAM, etc., which are generally used presently. Part of these memories has been already put into practical use.

In particular, the MRAM is capable of high-speed and almost-infinite ($10^{15}$ times or more) rewriting because data is stored based on the magnetization direction of a magnetic body. The MRAM has been already used in the fields of the industrial automation, the airplane, etc. Because of its high-speed operation and high reliability, the MRAM is expected to be expanded into the code storage and the working memory in the future. However, it still has challenges in power consumption reduction and capacity increase in practice. They are fundamental challenges attributed to the principle of recording in the MRAM, i.e. the system in which magnetization reversal is caused by a current magnetic field generated from an interconnect.

As one method to solve this problem, studies are being made on a system of recording, i.e. magnetization reversal, that is not based on the current magnetic field. Particularly, researches relating to spin torque magnetization reversal are active. A storage element by the spin torque magnetization reversal is configured with magnetic tunnel junction (MTJ) as with the MRAM. This configuration utilizes a characteristic that spin-polarized electrons passing through a magnetic layer pinned to a certain direction give torque to another magnetic layer that is free (whose direction is not fixed) when entering this magnetic layer. In this configuration, the flow of a current equal to or larger than a certain threshold value causes reversal in the free magnetic layer. Rewriting of 0/1 is performed by changing the polarity of the current. The absolute value of the current for this reversal is equal to or smaller than 1 mA in an element with scale of about 0.1 µm. In addition, scaling is possible because this current value decreases in proportion to the element volume. Moreover, this system does not require the word line for generating the current magnetic field for recording, which is necessary for the MRAM, and therefore also has an advantage that the cell structure may be simpler.

Hereinafter, the MRAM utilizing the spin torque magnetization reversal will be referred to as the ST-MRAM (spin torque-magnetic random access memory). Great expectations are placed on the ST-MRAM as a non-volatile memory that enables power consumption reduction and capacity increase while keeping the MRAM's advantages that high-speed operation is possible and the number of times of rewriting is almost infinite.

However, in the ST-MRAM, voltage is applied to the MTJ also in recording differently from the related-art MRAM. This voltage in recording is higher than the read voltage. Therefore, the possibility of the occurrence of the electrical breakdown of the MTJ (attributed mainly to e.g. the dielectric breakdown of a thin tunnel barrier) is higher compared with the MRAM. That is, to ensure high rewriting endurance equivalent to that of the related-art MRAM in the ST-MRAM, it is important to pay attention to the electrical breakdown of the MTJ and take measures to avoid it.

As one of the measures, there is proposed e.g. a method of suppressing the deterioration of an insulator by applying a reverse-polarity voltage (refer to e.g. Nakano et. al., ECS Trans. 19(2), 711 (hereinafter, Non Patent Document 1)). This technique aims at suppressing a resistance decrease at the tunnel junction due to electric field application by applying a pulse voltage of the reverse polarity.

It is inferred that two processes, i.e. a reversible process and an irreversible process, exist in the dielectric breakdown in a rough classification (refer to e.g. P. S. Ku et. al Proc. of 44th Annual international Reliability Physics Symposium, p. 437 (hereinafter, Non Patent Document 2)). The reversible process is equivalent to that an annihilable defect is generated due to an electric field or coupling between atoms forming the insulator is deformed in a restorable range due to an electric field. This annihilation or restoration of the defect is realized by aging, heat treatment, etc. On the other hand, the irreversible process is equivalent to that coupling between atoms is broken into a restoration-impossible state due to an electric field, and thus recovery is impossible in this process.

SUMMARY

However, in the above-described Non Patent Document 1, the physical mechanism of the technique is not clear. Furthermore, in the above-described Non Patent Document 2, the origin of the recovery acceleration effect is unclear. As just described, these documents do not refer to increase in the number of times at reaching to the breakdown of the tunnel insulating film although including a description relating to the capability of suppression of the resistance value decrease.

Furthermore, in the ST-MRAM, it is desired to comparatively easily decrease the possibility of the electrical breakdown of the MTJ and the electrical breakdown of the tunnel insulating film without requiring large changes in the MTJ material, the microfabrication process, and so forth.

There is a desire for the present disclosure to provide a method for driving a storage element and a storage device each allowing suppression of electrical breakdown.

According to an embodiment of the present disclosure, there is provided a method for driving a storage element that has a plurality of magnetic layers and performs recording by utilizing spin torque magnetization reversal. The method includes applying a pulse voltage having reverse polarity of the polarity of a recording pulse voltage in application of the recording pulse voltage to the storage element.

According to another embodiment of the present disclosure, there is provided a storage device including a storage element configured to have a storage layer and a pinned layer with the intermediary of a tunnel barrier layer, a power supply circuit configured to apply a pulse voltage to the storage element, and an inductance configured to be provided between the storage element and the power supply circuit.

In the method for driving a storage element according to the embodiment of the present disclosure, by applying the pulse voltage of the reverse polarity of that of the recording pulse, recovery of a defect generated in the element due to application of the recording pulse voltage can be accelerated. Thus, the electrical breakdown of the element due to increase in the defect can be suppressed.

Furthermore, in the storage device according to the embodiment of the present disclosure, undershoot is generated at the falling edge of the recording pulse voltage due to the provision of the inductance between the storage element and the power supply circuit. By employing this undershoot as the pulse voltage having the reverse polarity of that of the recording pulse, the electrical breakdown of the element can be suppressed.

The embodiments of the present disclosure can decrease the possibility of the occurrence of electrical breakdown in a storage element that performs recording by utilizing spin torque magnetization reversal.

DETAILED DESCRIPTION OF THE PREFERRED EMBODIMENTS

Mode examples for carrying out the present disclosure will be described below. However, the present disclosure is not limited to the following examples.

The order of the description is as follows.
1. Outline of the present disclosure
2. Embodiment of the present disclosure 1. Outline of the Present Disclosure Prior to description of a specific embodiment of the present disclosure, the outline of the present disclosure will be described below.

Figure 1:
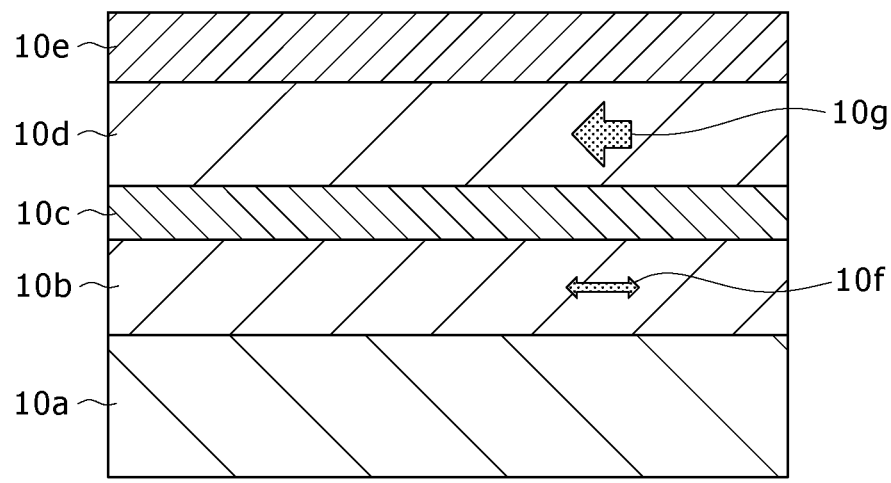
FIG. 1 is a sectional view showing the configuration of an ST-MRAM according to an embodiment of the present disclosure.

FIG. 1 is a schematic sectional view of an ST-MRAM. The ST-MRAM is composed of a base layer $10a$, a storage layer $10b$ (referred to also as a magnetization storage layer or a free layer), a non-magnetic layer (tunnel barrier layer) $10c$, a pinned layer (magnetization pinned layer) $10d$, and a protective layer $10e$. The storage layer $10b$ is formed of a ferromagnetic body having a magnetic moment $10f$ whose magnetization direction freely changes to a direction parallel to the film surface (horizontal direction). The pinned layer $10d$ is formed of a ferromagnetic body having a magnetic moment $10g$ whose magnetization direction is fixed to a direction parallel to the film surface (horizontal direction).

Information is stored based on the orientation of the magnetic moment $10f$ of the storage layer $10b$ having uniaxial anisotropy. Writing is performed by applying a current in a direction perpendicular to the film surface to thereby cause spin torque magnetization reversal.

A simple description will be made below about the spin torque magnetization reversal. Electrons have two kinds of spin angular momenta. Suppose that these momenta are an upward momentum and a downward momentum. The numbers of both electrons are the same inside a non-magnetic body, whereas difference exists between the numbers of both electrons inside a ferromagnetic body. A consideration will be made below about the case in which electrons are moved from the pinned layer $10d$ to the storage layer $10b$ when the orientations of the magnetic moments $10f$ and $10g$ are in the anti-parallel state in two ferromagnetic layers included in the ST-MRAM, i.e. the pinned layer $10d$ and the storage layer $10b$.

The pinned layer $10d$ is a pinned magnetic layer in which the orientation of the magnetic moment log is fixed because of high coercivity. Electrons that have passed through the pinned layer $10d$ are in the spin-polarized state. That is, difference arises between the number of upward-spin electrons and the number of downward-spin electrons. If the thickness of the non-magnetic layer $10c$ is sufficiently small, the electrons reach the other magnetic body, i.e. the storage layer $10b$, before the spin polarization due to the passage through the pinned layer $10d$ is alleviated and the electrons enter the non-polarized state (the numbers of the upward-spin electrons and downward-spin electrons are the same) in a normal non-magnetic body. In the storage layer $10b$, the sign of the spin polarization degree is reversed. Thus, to lower the energy of the system, reversal occurs in partial electrons, i.e. the orientation of the spin angular momentum changes. At this time, the overall angular momentum of the system has to be conserved. Therefore, reaction equivalent to the total of the change in the angular momentum due to the electrons whose orientation changed is given also to the magnetic moment of the storage layer $10b$.

If the current, i.e. the number of electrons passing per unit time, is small, the total number of electrons whose orientation changes is also small and thus the change in the angular momentum occurring in the magnetic moment of the magnetic layer $10b$ is also small. However, increase in the current can give a larger change in the angular momentum in the unit time. The time change of the angular momentum is torque. If the torque surpasses a certain threshold value, the magnetic moment $10f$ of the magnetic layer $10b$ starts precession and becomes stable at the completion of rotation by 180 degrees because of its uniaxial anisotropy. That is, reversal from the antiparallel state to the parallel state occurs.

In the magnetization parallel state, a current is applied in such a direction that electrons are sent from the storage layer 10b to the pinned layer 10d reversely. This time, the electrons whose spin is reversed in reflection by the pinned layer 10d give torque to the storage layer 10b when entering this layer, so that the magnetic moment 10f can be reversed to the antiparallel state. However, the amount of current necessary to cause this reversal is larger than that for the reversal from the antiparallel state to the parallel state.

It is difficult to intuitively understand the reversal of the magnetic moments 10f and 10g from the parallel state to the antiparallel state. However, it will be possible to think that the magnetic moment can not be reversed because the pinned layer 10d is fixed and thus reversal in the free layer occurs to conserve the angular momentum of the whole system. In this manner, recording of 0/1 is performed by applying a current that is equal to or larger than a certain threshold value and corresponds to the respective polarities in the direction from the pinned layer 10d to the storage layer 10b or in the opposite direction.

Information is read out by using the magneto-resistance effect similarly to the related-art MRAM. Specifically, a current is applied in a direction perpendicular to the film surface similarly to the case of the above-described recording. At this time, the electrical resistance exhibited by the element changes depending on whether the magnetic moment 10f of the storage layer 10b is parallel or antiparallel to the magnetic moment 10g of the pinned layer 10d. Information is read out by utilizing this phenomenon.

The material used as the non-magnetic layer 10c may be either a metal or an insulator. However, a higher read signal (change rate of the resistance) is obtained and recording is permitted by a smaller current if an insulator is used as the non-magnetic layer 10c. Such an element is referred to as the magnetic tunnel junction (MTJ).

The reversal current Ic of the MTJ can be represented as follows.

parallel→antiparallel $Ic = (A \cdot \alpha \cdot Ms \cdot V/g(0)P)(Hk+2\pi Ms)$ antiparallel→parallel $Ic = -(A \cdot \alpha \cdot Ms \cdot V/g(\pi)P)(Hk+2\pi Ms)$ In these equations, A denotes a constant. α denotes the damping constant. Ms denotes the saturation magnetization. V denotes the element volume. g(0)P and g(π)P denote coefficients corresponding to the efficiency of transmission of spin torque to the counterpart magnetic layer in the parallel state and the antiparallel state, respectively. Hk denotes a magnetically-anisotropic magnetic field.

The value obtained by multiplying this current by the resistance of the MTJ is equal to the voltage in recording.

When this recording current (voltage) is compared with the current flowing through the storage element in reading generally as described above or the voltage across the element, the recording current (voltage) is sufficiently larger. This is natural also in terms of the principle of spin torque magnetization reversal. Furthermore, the difference in the current (voltage) is necessary to avoid operation of erroneous recording in reading (so-called disturb). Moreover, the difference is necessary to intentionally ensure a sufficient margin designed also in consideration of variation between the recording voltage and the read voltage. The issue here is the upper limit of the recording current (or voltage), which is sufficiently larger than the read current (or voltage).

The thickness of the non-magnetic insulator (tunnel barrier) used in the MTJ is as very small as about 1 nm, and thus possibly dielectric breakdown occurs if too high a voltage is applied. This is the same also when a metal is used as the non-magnetic body. When a metal is used, breakdown involving e.g. electromigration due to a large current occurs. Such breakdown of the non-magnetic insulator (tunnel barrier) due to a current is an ST-MRAM-specific problem that does not have to be considered in the related-art MRAM, which performs recording by an interconnect magnetic field.

To solve this problem, it is preferable to ensure a sufficient margin also between the recording voltage and the dielectric breakdown voltage of the tunnel barrier if only the MTJ is considered exclusively.

So, in connection with the above-described problem, in the present disclosure, the method of recording voltage application is controlled to thereby suppress the dielectric breakdown of the tunnel barrier in MTJ for an ST-MRAM having given recording voltage and dielectric breakdown voltage. Specifically, the present disclosure proposes a method for suppressing the occurrence of the breakdown by controlling the shape of a pulse voltage applied in recording. More specifically, undershoot is introduced at the falling edge of the pulse voltage in recording. Specifically, the dielectric breakdown is suppressed by introducing undershoot through preparation of a circuit to apply, subsequently to the recording voltage pulse, a voltage having shorter application time and smaller absolute value compared with the recording voltage pulse and having the polarity opposite to that of the recording voltage pulse.

In general, the dielectric breakdown can be roughly classified into two kinds of breakdown. The breakdown that instantaneously occurs independently of the time due to application of a comparatively-high voltage is referred to as TZDB. On the other hand, the breakdown that occurs as the result of continuation of application of a comparatively-low voltage for a long time is referred to as TDDB.

In reliability evaluation of a storage element, the case in which recording is repeatedly performed by a voltage lower than such a voltage as to cause instantaneous breakdown (TZDB) is envisaged because of its principle. That is, focus is placed on TDDB in the present disclosure. The dependence of TDDB on the time in the above description may be interpreted as the dependence thereof on the product of the pulse width of the recording voltage and the number of times of application thereof (the number of cycles). For example, this TDDB should be considered for a discussion about a guarantee for that breakdown does not occur even if recording is performed several-powers-of-ten times.

If TDDB is considered as the product of the pulse width and the number of cycles, the duty ratio, i.e. the ratio of the time during which the pulse voltage is applied to the time during which it is not applied, should also be considered. This is because a phenomenon of alleviation of deterioration accumulation (this phenomenon will be referred to as "recovery") occurs in the time zone during which the pulse is not applied (this time zone will be referred to as "pause time"). In the above-described Non Patent Document 2, accumulation and recovery of deterioration are explained based on generation and alleviation of the "reversible trap" at the initial stage of breakdown. However, Non Patent Document 2 says that the physical mechanism thereof is not clear. The deterioration appears as a phenomenon that the resistance value gradually decreases as the cumulative time of the pulse voltage increases. On the other hand, the recovery can be determined based on a phenomenon that the resistance rises from this decreased state to the normal value again.

Regarding suppression of TDDB by alleviation of the reversible trap, the above-described Non Patent Document 1 reports the effect of accelerating recovery by applying a reverse-polarity voltage in the pause time. However, the origin of this recovery acceleration effect is unclear.

So, the present disclosure relates to a comparatively-simple method for suppressing TDDB by aggressively utilizing the above-described recovery effect and recovery acceleration effect. Specifically, an insulating layer in the reversible process is recovered by introducing undershoot at the falling edge of the pulse voltage in recording. This will be based on a principle similar to that of the method for suppressing the deterioration of an insulator by application of a reverse-polarity voltage, described in the above-described Non Patent Document 1. Specifically, it will be possible to restore an annihilable defect or deformation generated due to application of the recording voltage by applying a reverse-polarity voltage to the defect or deformation. By repeating generation of a defect due to application of the recording voltage and restoration of the defect by undershoot in this manner, dielectric breakdown due to the shift from the reversible process to the irreversible process can be suppressed.

2. Embodiment of the Present Disclosure

[Configuration Example of ST-MRAM for Evaluation]

Figure 2:
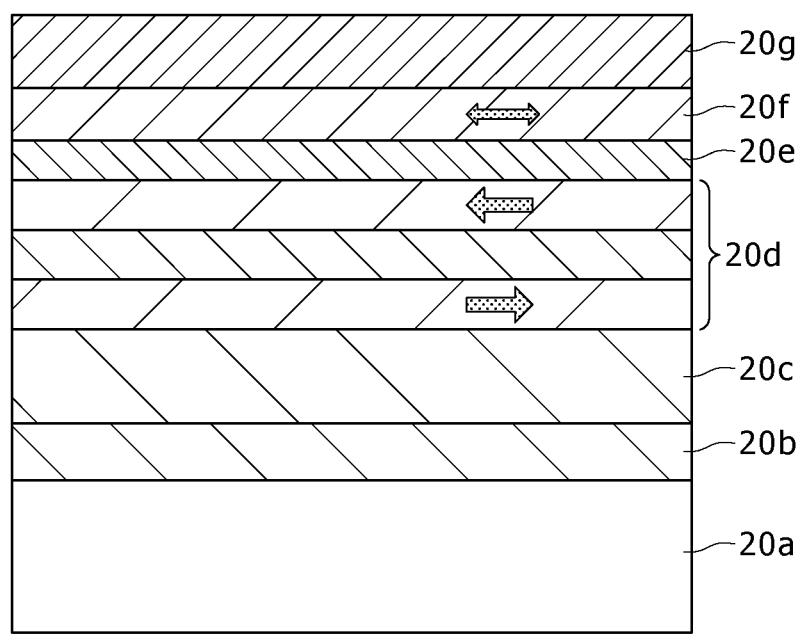
FIG. 2 is a sectional view of an MTJ-type ST-MRAM chip for evaluation according to the embodiment of the present disclosure.

An embodiment of the present disclosure will be described below. FIG. 2 is a sectional view of an MTJ-type ST-MRAM chip for evaluation. This storage element is an MRAM utilizing spin torque magnetization reversal (spin torque-magnetic random access memory (ST-MRAM)).

The MTJ element for evaluation has a configuration obtained by sequentially stacking, over a substrate 20a, a base layer 20b, an antiferromagnetic layer 20c, a pinned layer 20d, a tunnel barrier layer (non-magnetic layer) 20e, a free layer (storage layer) 20f, and a cap layer (protective layer) 20g.

In fabrication of the above-described MTJ element for evaluation, first a 5-nm-thick Ta layer is formed as the base layer 20b on the substrate 20a having a complementary metal oxide semiconductor (CMOS). Subsequently, 20-nm-thick PtMn is formed as the antiferromagnetic layer 20c on the base layer 20b. Over the antiferromagnetic layer 20c, 2-nm-thick CoFe, 0.8-nm-thick Ru, and 2-nm-thick CoFeB are stacked as the pinned layer 20d having a synthetic ferri-magnetic structure. Subsequently, over the pinned layer 20d, 1-nm-thick MgO as the tunnel barrier layer 20e, 1.8-nm-thick CoFeB as the free layer 20f, and 5-nm-thick Ta as the cap layer 20g are sequentially stacked. Through the above-described steps, a multilayer body is formed. This multilayer body can be formed by using sputtering.

Next, the above-described multilayer body is processed into a minute tunnel junction by using lithography and etching. The shape of the tunnel junction is an ellipse with a size of 70 nm×200 nm.

The fabricated chip is used for a reliability test and a CMOS transistor for cell selection is so designed as to be capable of applying a sufficiently-high voltage to cause dielectric breakdown across the MTJ element.

The above-described MTJ element is pursuant to the MTJ-type ST-MRAM of FIG. 1. However, for example, the structure can be changed within the range outside problems relating to the essence of spin torque magnetization reversal. For example, the order of the pinned layer and the free layer may be reversed and the pinned layer may have a structure other than a synthetic ferri-magnetic structure.

[Method for Evaluating MTJ Element]

Figure 3:
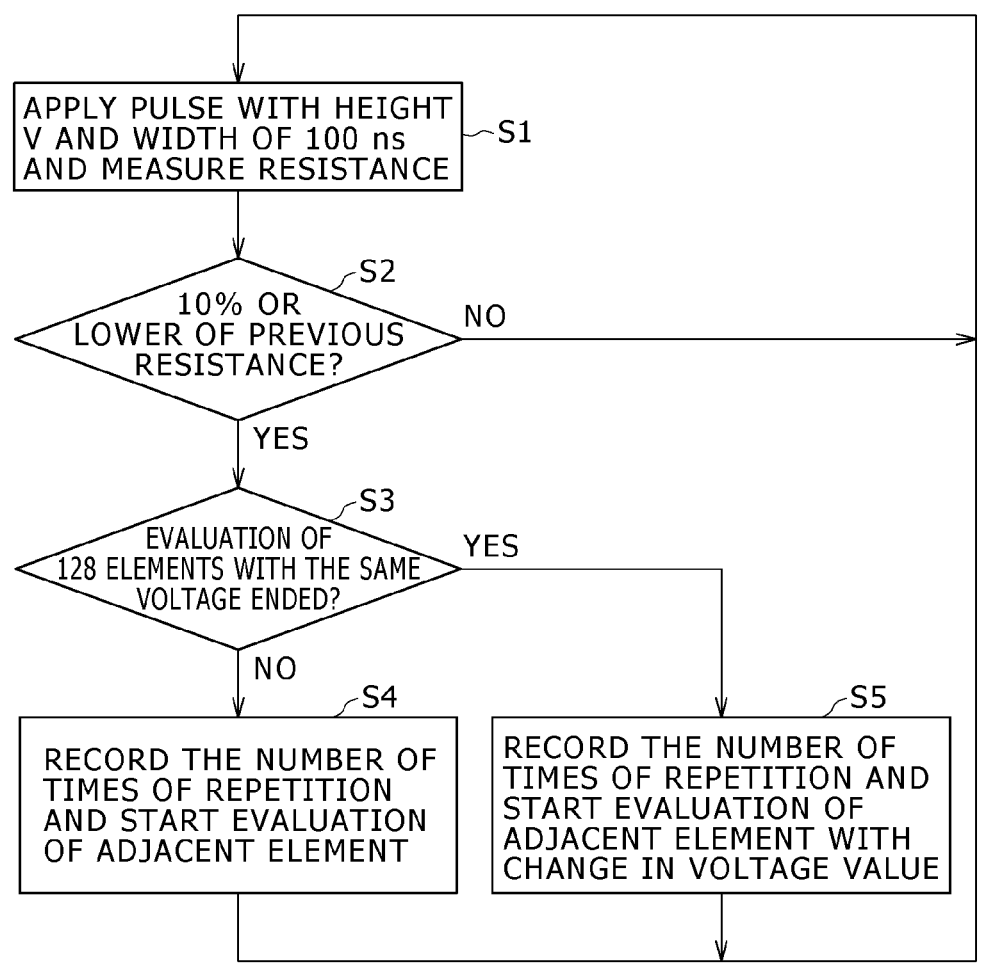
FIG. 3 is a flowchart for explaining a method for evaluating an MTJ element.
Figure 4:
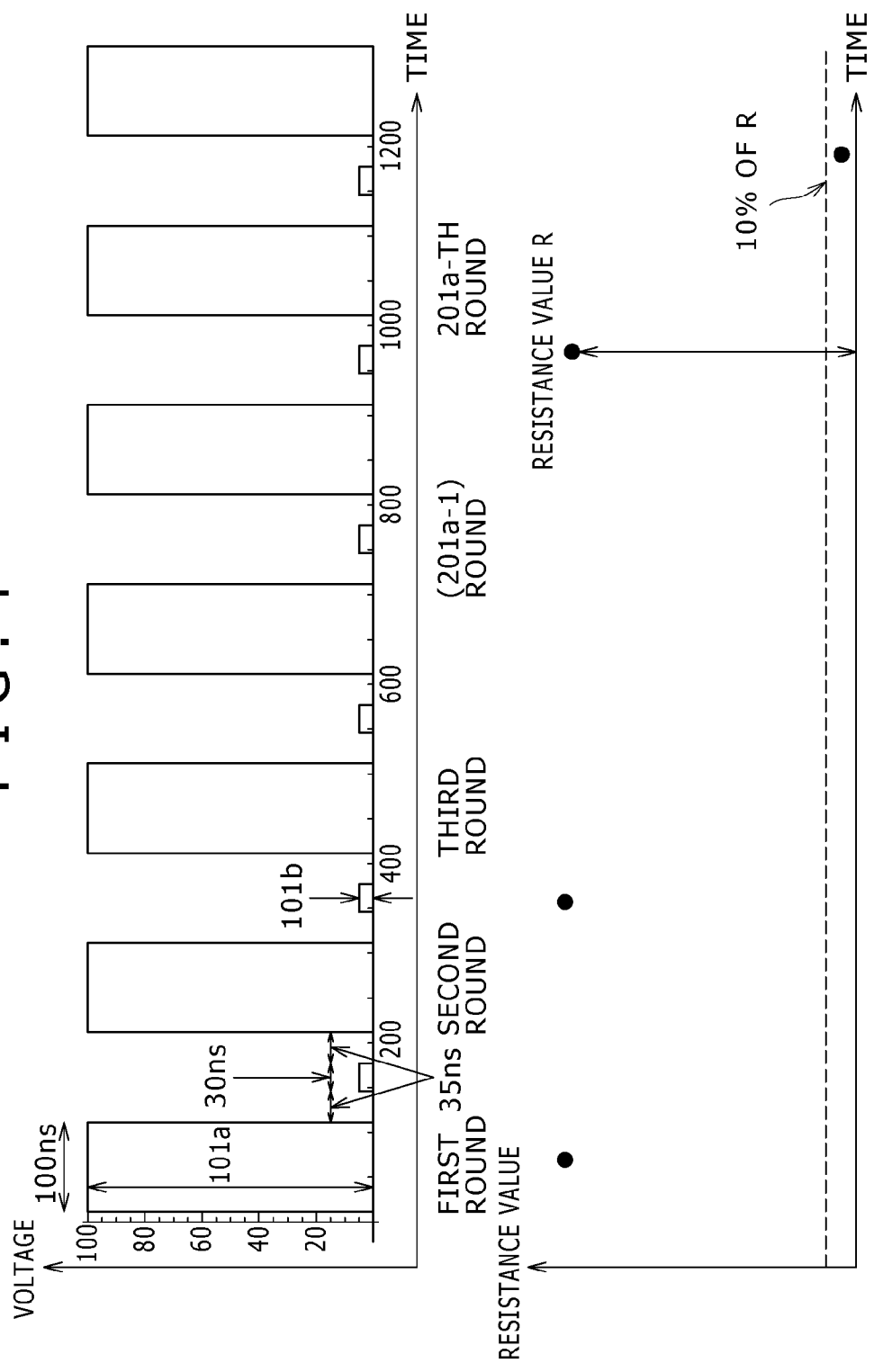
FIG. 4 is a diagram for explaining a determination process in the evaluation method shown in FIG. 3.

FIG. 3 shows a method for evaluating the above-described MTJ element. FIG. 4 shows the outline of a process of determining breakdown with the repetition of voltage application in FIG. 3. In FIG. 4, the number of times of repetition (elapsed time) is plotted on the abscissa and the correlation between the applied voltage and the resistance value of the MTJ element is represented on the ordinate for each of the numbers of times. The specific evaluation method will be described below by using the flowchart shown in FIG. 3 and the process shown in FIG. 4.

First, a pulse with a height V and a width of 100 ns is applied to the MTJ element for evaluation and the resistance value R of the ST-MRAM for evaluation is measured (step S1). In this method, a predetermined voltage value 101a is set and the pulse having the same magnitude 101a is repeatedly applied to one MTJ element. A voltage 101b sufficiently lower than 101a is applied in the time between the application times of two pulses, and the resistance value of the MTJ is measured.

The resistance value measured in the step S1 is compared with the resistance value R before pulse application and it is determined whether the measured resistance value is equal to or smaller than 100 (step S2). If the resistance value measured after the pulse voltage is applied arbitrary times 201a is decreased to 100 or smaller of the resistance value measured after the pulse voltage application of the previous time ((201a-1)-th round), it is determined that the breakdown has occurred at the 201a-th round. Furthermore, this number 201a of times of application is recorded. If the measured resistance value is not equal to or smaller than 100, the pulse with the height V and the width of 100 ns is applied again and the resistance of the MTJ element is measured (step S1).

It is determined whether the number of measured elements has reached the prescribed number (step S3). If the number of measured elements has not reached the prescribed number, the number of times of repetition is recorded and adjacent another MTJ element is evaluated (step S4). Because the fabricated elements have variation, the same result is not necessarily obtained from an MTJ element 201a and an MTJ element 201b adjacent thereto. Therefore, the same experiment is performed for plural elements adjacent to each other in the same chip and the number 201b of times at reaching to breakdown is recorded. In this manner, the experiment is performed for an arbitrary number of elements, e.g. 128 elements, and the average of the obtained numbers of times at reaching to breakdown is employed as the number 201 of times at reaching to breakdown corresponding to the voltage value 101a.

In the above-described evaluation, the pulse width is set to 100 ns in recording and to 30 ns in reading. Furthermore, an interval of 35 ns is provided between the application of the pulse 101a and the application of the pulse 101b. The voltage in reading is set to about 10 mV.

If the number of measured elements has reached the prescribed number, the number of times of repetition is recorded. Thereafter, the voltage value is changed and an adjacent MTJ element in the same chip is evaluated (step S5). The voltage is changed from 101a to 102a and the same experiment is performed to record the number 202 of times at reaching to breakdown. In this manner, for different four voltage values, four kinds of the numbers of cycles at reaching to breakdown (the numbers of times at reaching to breakdown) are obtained.

[Evaluation Result]

Figure 5:
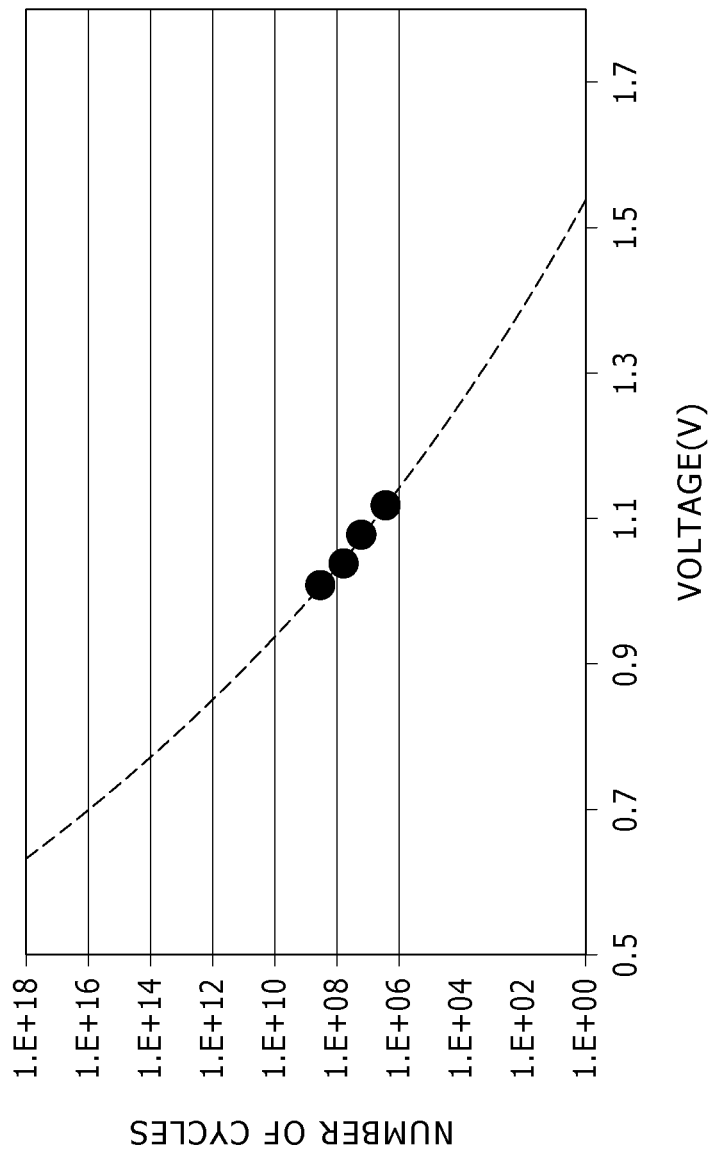
FIG. 5 is a diagram showing the relationship between the number of times at reaching to breakdown about the MTJ element and the applied voltage.

FIG. 5 shows the relationship between the number of times at reaching to breakdown about the MTJ element, obtained by the above-described evaluation, and the applied voltage. In FIG. 5, the abscissa indicates the voltage and the ordinate indicates the number of times at reaching to breakdown. The evaluation result is represented by a black circle.

It turns out that breakdown occurs even with a lower voltage when the number of cycles is larger as described above. The dashed line shown in FIG. 5 is a curve obtained by fitting of the evaluation results by the following power function.

$$nc = A \times Vc^B \quad (1)$$

In this function, nc denotes the number of cycles at reaching to breakdown. Vc denotes the voltage.

The polynomial approximation shown by equation (1) is called the power law model and is generally used in the case of approximating the number of cycles of the breakdown voltage or the application time dependence. Repeating the experiment a large number of times is difficult in terms of the time restrictions. Therefore, it is general to employ a method in which data on the lower-voltage and higher-cycle side are estimated through acceleration with a higher voltage and fitting into a model.

[Consideration of Evaluation Result: Recovery and Acceleration of Recovery]

Based on the above-described evaluation result, a discussion will be made below about the recovery effect and the recovery acceleration effect by a reverse bias, shown in the above-described Non Patent Document 1 and Non Patent Document 2. It is possible to consider the recovery effect and the recovery acceleration effect by a reverse bias in the following manner although the origin is not clear.

TDDB can be understood as the following phenomenon.

First, as the first stage to breakdown, any defect is generated in repeated application of such a comparatively-low voltage that one time of application thereof does not reach breakdown. Subsequently, as the second stage, the number of defects increases due to the repetition of the voltage application. Breakdown occurs in the insulating layer at the timing when the generated defects form a path of current flow based on any mechanism between the electrodes on both sides of the insulator. Not only metallic conduction but also e.g. hopping conduction is also possible as the mechanism.

However, the defect generated at the first stage is reversible, i.e. has a possibility of being annihilated. For example, in MgO used as the tunnel barrier layer in the above-described MTJ element for evaluation, a defect generated due to the shift of an oxygen ion from its original lattice position in the NaCl-type crystalline structure can return to the original lattice point by the effect of aging (pause period). Such a phenomenon of alleviating deterioration accumulation is the recovery. Furthermore, because the oxygen ion has a charge, it is subjected to force from an electric field. Thus, applying an electric field having proper polarity and magnitude causes the return of the oxygen ion to the lattice point more rapidly. This is the recovery acceleration effect by reverse bias application.

[Consideration of Evaluation Result: Modeling of Evaluation of MTJ Element]

The following extremely-simplified model will be considered in order to explain the phenomenon that the above-described charged defect is annihilated before being neutralized.

First, because breakdown is a phenomenon occurring due to an electric field (voltage pulse), a charge has relation to it. For the occurrence of the recovery, a mechanism in which the charge is restored (recovered) after the electric field is removed (pause period). If the charge returns to the original state without any trace after the electric field is removed, the breakdown does not occur eternally. However, if a sufficiently-long time for complete restoration is not obtained, the next voltage pulse is applied in a state slightly different from the original state. In this manner, the complete recovery is not achieved and a state in which a defect is slightly generated is accumulated to increase, so that breakdown occurs when the defect-accumulation level surpasses the tolerance level. Alternatively, although the breakdown does not occur at that moment, the insulator is put to such a state as to have no choice other than to be broken eventually.

One charged particle will be considered. The defect arises due to the movement of a particle attributed to Coulomb's force received from an electric field. This moved particle receives attraction force from the original stable place (site) and will return to the original position simultaneously with removal of the electric field. Furthermore, resistance in proportion to the speed acts in the return process and a certain level of a time constant will exist.

The above-described particle movement is damped oscillation on which pulse-manner compelling force periodically acts. The motion can be represented by the following equation if the position of the particle on a one-dimensional coordinate after t seconds is defined as x[t].

$$m(d^2/dt^2)x[t] = -2\rho(d/dt)x[t] - \omega^2 x[t] + F \quad (2)$$

In this equation, m denotes the mass of the particle. $\rho$ denotes a coefficient having relation to friction or viscosity. $\omega$ denotes the constant of attraction force received from the original site. F denotes external force.

If the charge of the particle is defined as q and the applied electric field is defined as E=V/d (V: applied voltage, d: thickness of insulator), F is represented by the following equations.

$$F = qV/d \text{ (when pulse voltage is applied)} \quad (3)$$

$$F = 0 \text{ (pause period)} \quad (4)$$

$$F = -qV/d \text{ (when reverse bias is applied)} \quad (5)$$

If equations (2) and (3) to (5) are solved based on the assumption that a pulse voltage (pulse electric field) is intermittently applied, a phenomenon that the particle is shifted from the original position with oscillation is derived depending on the values of $\rho$ and $\omega$.

Figure 6:
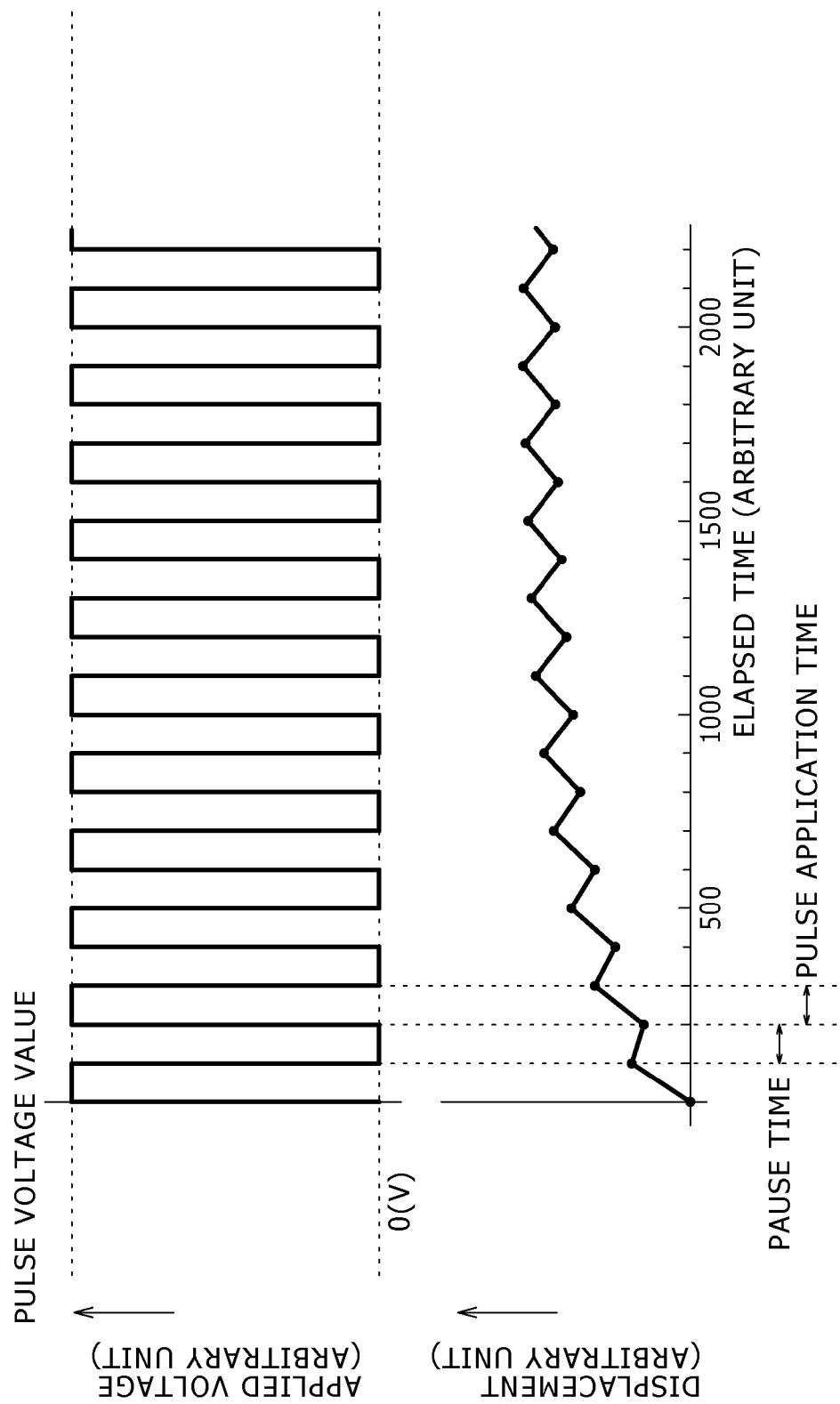
FIG. 6 is a diagram showing the relationship between a position x[t] and the number n of times of repetition when a pulse voltage is intermittently applied.

FIG. 6 shows an example of calculation of the relationship between the position x[t] after t seconds and the number n of times of repetition. In FIG. 6, the number of times of repetition (elapsed time) is plotted on the abscissa and the correlation between the applied voltage and the amount of movement (displacement) of the particle is represented on the ordinate for each of the numbers of times. In this case, $\rho$ and $\omega$ are so set as to match the above-described phenomenon. In the example of FIG. 6, $\rho$=250 and $\omega$=1. m and q are set to 1 for simplification. However, these values (m, q) and the units may be left as constant terms as described later.

In the example shown in FIG. 6, focus will be placed on the phenomenon that the amount of displacement gradually increases over time. Furthermore, a consideration will be made about a model in which dielectric breakdown occurs when the amount of gradually-increasing displacement surpasses the threshold value. In this case, the displacement can be represented by a power function shown by the following equation (6) if the maximum value of the displacement, i.e. the displacement immediately before the end of pulse application, is represented as a function of the time and the calculation result is subjected to fitting by various kinds of functions.

$$x[t] = a \times V \times t^b \quad (6)$$

In equation (6), x[t] denotes the displacement after t seconds. V denotes the pulse voltage. t denotes the time. a and b are constants.

If the pulse application time is set constant, the elapsed time is in proportion to the number of times of pulse application. Therefore, if the number of times of pulse application at reaching to breakdown in the case of a voltage Vc is defined as nc and the displacement at this time is defined as xc, the above-described equation (6) can be rewritten from a function of the time to an equation of the number of times of pulse application as shown in the following equation (7).

$$xc = a' \times Vc \times nc^b \qquad (7)$$

Next, focus will be placed on the similarity between equation (1) and equation (7). If equation (1) is logarithmically represented, the following equation is obtained.

$$\log nc = \log A + B \times \log Vc \qquad (8)$$

Furthermore, if equation (7) is logarithmically represented similarly, the following equation is obtained.

$$\log xc = \log a' + \log Vc + b \times \log nc \therefore \log nc = (1/b)(\log xc - \log a') - (1/b)\log Vc \qquad (9)$$

When equation (8) is compared with equation (9), an equivalent relationship can be found regarding the point that the logarithm of the number nc of cycles at reaching to breakdown is represented by an linear expression of the logarithm of the voltage Vc.

Equation (8), obtained by transforming equation (1), is a publicly-known model relating to TDDB, and it can also be confirmed that the experimental result shown in FIG. 5 can be explained well from this model. On the other hand, equation (9), obtained by transforming equation (6), is a result derived from an extremely-simple model, damped oscillation of one object on which compelling force acts. That the above-described equation (9) and the above-described equation (8) have an equivalent relationship means that TDDB can be described by the above-described simple model at least in this relationship (linear relationship between the logarithm of nc and the logarithm of Vc).

Equations (8) and (9) do not necessarily correspond with each other regarding the constant terms that have no relation to log Vc. However, the constant terms will be ignored because they have no relation to the essence of the following description and focus will be placed on the coefficient B in equation (8) and the coefficient (1/b) in equation (9). The units of the time and the voltage and the charge q of the particle are included in the above-described constant terms and thus they will also be ignored in the following description because the constant terms have no relation to the essence of the following description.

As described above, the above-described equation (8) and the above-described equation (9) can be represented with the same form. Thus, by taking the experimental result shown in FIG. 5 as the starting point, the relationship between nc and Vc corresponding to various parameters can be derived as the above-described simple damped oscillation model by calculation without using experiment. Specifically, the relationship between the number nc of cycles at reaching to breakdown and the applied voltage Vc can be derived by calculation with use of the pulse voltage, the pulse application time, the pause time, and so forth as parameters.

[Description of Driving Method of Present Embodiment]

A driving method according to the embodiment of the present disclosure will be described below.

In the driving method of the present embodiment, the pulse voltage applied in recording is so set as to have such a shape that undershoot is introduced after the falling edge of the pulse. By introducing the undershoot, a reverse-polarity pulse can be automatically applied by recording pulse application.

As preparation for deriving the above-described relationship between nc and Vc by calculation, the central force $\omega$ and the friction coefficient $\rho$ of the material should be known in order to explain the experimental result.

These $\omega$ and $\rho$ can be obtained by setting the same experiment as the above-described one of FIG. 5 and seeking $\rho$ and $\omega$ giving 1/b equal to B obtained from the relationship shown in FIG. 5. Specifically, in the case of setting a condition that a pulse voltage of 100 ns is applied and then a pause is taken for 100 ns (the same condition as that of the evaluation method shown in FIG. 4), $\rho=36.04$ and $\omega=1.00$ are obtained as $\rho$ and $\omega$ giving 1/b equal to B obtained from the relationship shown in FIG. 5. By fixing $\rho$ and $\omega$ to these values and changing the height and width of the pulse, the value of the coefficient b can be obtained. In addition, the value of B can be obtained from the value of the coefficient b.

Figure 7:
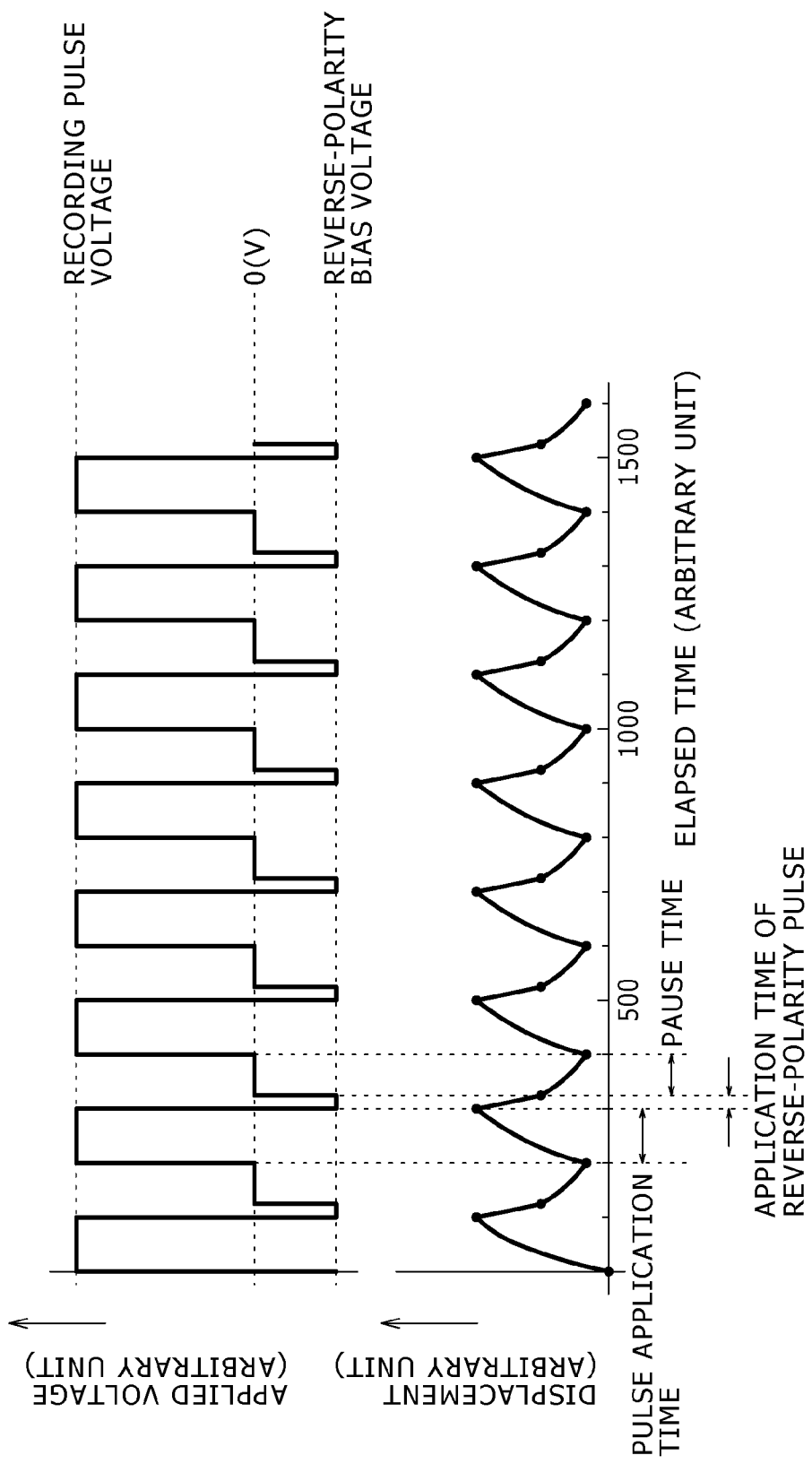
FIG. 7 is a diagram showing the relationship between the position x[t] and the number n of times of repetition in a driving method of the embodiment.

As a driving method of introducing undershoot after the falling edge of the recording pulse, for example, after application of the recording pulse of 100 ns, a reverse-polarity pulse having the absolute value equal to 450 of the absolute value of the recording pulse is applied for 25 ns. FIG. 7 shows an example of calculation of the relationship between the position x[t] after t seconds and the number n of times of repetition in this case. In FIG. 7, the number of times of repetition (elapsed time) is plotted on the abscissa and the correlation between the applied voltage and the amount of movement (displacement) of the particle is represented on the ordinate for each of the numbers of times, similarly to FIG. 6.

As shown in FIG. 7, the amount of displacement of the particle displaced by application of the pulse voltage decreases by application of the reverse-polarity bias during its application time. Furthermore, also in the pause time, the speed of the decrease in the amount of displacement is enhanced compared with the case shown in FIG. 6. In this manner, due to the application of the reverse-polarity bias, the return of the particle to its original lattice point occurs more rapidly compared with the case shown in FIG. 6. Therefore, the speed of the decrease in the amount of displacement is enhanced. Thus, the increase rate of the amount of displacement is low even when the application of the pulse voltage is repeated.

Figure 8:
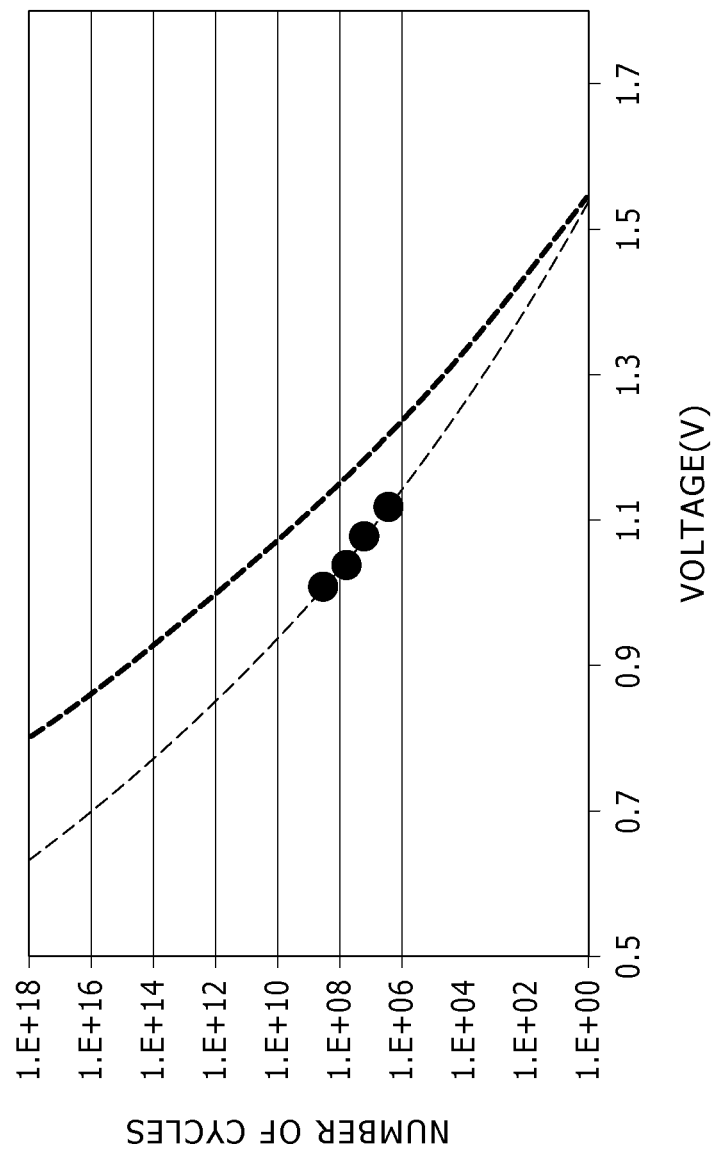
FIG. 8 is a diagram showing the relationship between the number of times at reaching to breakdown about the MTJ element and the applied voltage.

The solid line shown in FIG. 8 indicates the result achieved by obtaining the value of B in equation (8) from the value of b in equation (9) obtained with the above-described parameters and plotting the value of B on the same graph as that of FIG. 5.

In FIG. 8, for the experimental data shown in FIG. 5, the curve obtained when $\rho=36.04$ and $\omega=1.00$ are set in the above-described damped oscillation model is also shown. This curve completely corresponds with the fitting curve shown in FIG. 5. For this result, the same condition as that of the evaluation method shown in FIG. 4 is set in the decision of $\rho$ and $\omega$ for comparison between the above-described result obtained with application of a reverse-polarity bias and the result obtained without the application, shown in FIG. 5. For the result shown in FIG. 8, although the shift corresponding to the constant terms from the result shown in FIG. 5 arises, it is assumed that TZDB is the same because the MTJ elements have the same configuration, and diagrammatic representation is made based on the assumption that the MTJ elements have the same TDDB endurance (breakdown occurs at the timing of the same number of times) around 1.5 V.

The importance in the result shown in FIG. 8 is not the absolute value of the breakdown voltage but the change rate of the increase in the number of cycles in linkage with the lowering of the applied voltage. It turns out that, even if TZDB around 1.5 V is the same, the number of times of repetition for the same applied voltage increases in the case of a voltage lower than about 1.5 V due to application of a reverse-polarity bias. Therefore, it turns out that the repetition endurance (TDDB endurance) is higher when the reverse-polarity pulse is introduced than when it is not introduced.

As described above, it turns out that the introduction of the reverse-polarity pulse is useful for enhancement in the TDDB endurance in driving of the MTJ element. This is because, due to the introduction of the reverse-polarity pulse (undershoot), a negative electric field is applied in this region and restoration is accelerated. That is, the speed of the decrease in the amount of displacement of the moved particle in the insulating layer will be enhanced and the recovery will be accelerated by changing the pulse shape of the applied voltage from the pulse shape shown in FIG. 6 to the pulse shape having the undershoot shown in FIG. 7.

[Description of Driving Method of Present Embodiment: Reverse-Polarity Pulse]

As long as verification is made with the above-described simple model, the effect of TDDB suppression is found even when the absolute value of the reverse-polarity pulse is as large as two or three times that of the recording pulse. Furthermore, the effect of TDDB suppression is found even when the time of application of the reverse-polarity pulse is so long as to consume the whole pause time.

However, too large a reverse-polarity bias merely increases the power consumption and therefore is not preferable as application to the ST-MRAM. Moreover, the ST-MRAM is a memory to perform recording of 0/1 by a bipolar pulse. Therefore, if a reverse-polarity bias for enhancement in the TDDB endurance is applied after a pulse voltage for recording is applied, possibly writing in the direction opposite to that of the recording pulse is erroneously performed by the reverse-polarity bias.

Therefore, the absolute value of the reverse-polarity bias should be so small that writing in the opposite direction is not performed. This is not the rule that the absolute value of the reverse-polarity pulse should be smaller than that of the recording pulse. This is because, depending on the material and so forth, the recording characteristic is asymmetric, i.e. the absolute value of the voltage to write 0 is generally different from that of the voltage to write 1.

However, when the asymmetry of a general recording voltage is thought, it is sufficient that the absolute value of the reverse-polarity bias is set smaller than about half the absolute value of the recording pulse. As for the application time of the reverse-polarity bias, it is preferable that the application time be set shorter than that of the recording pulse in accordance with a general request that the cycle time should not be unnecessarily extended.

Therefore, in the method for driving a storage device, the following limit may be provided regarding the reverse-polarity bias.

If the absolute value of the reverse-polarity bias voltage is too small, no effect is obtained. On the other hand, too large an absolute value causes a possibility that the reverse-polarity bias voltage acts as a burden on the barrier adversely and a possibility that information once recorded becomes unstable to be rewritten. Therefore, it is preferable that the absolute value of the reverse-polarity bias be set in the range from 5% to 20% of the absolute value of the recording pulse.

The pulse width of the reverse-polarity bias should be equal to or longer than 50 of that of the recording pulse for exertion of the effect. However, the upper limit should be set in order to suppress loss of the cycle time and 20% of the pulse width of the recording pulse can be employed as a guide on the upper limit. The upper limit depends on the use purpose of the memory, and it is also possible to extend the pulse width of the reverse-polarity bias in the case of a memory that does not require a short cycle.

[Configuration Example of Storage Device]

A storage device according to the embodiment will be described below with FIG. 9.

The storage device of the present embodiment is so configured that undershoot is introduced after a pulse voltage in recording is applied as described above. As the configuration to generate the undershoot, inductance (coil) is provided between the recording pulse generating circuit and the MTJ for example.

Figure 9:
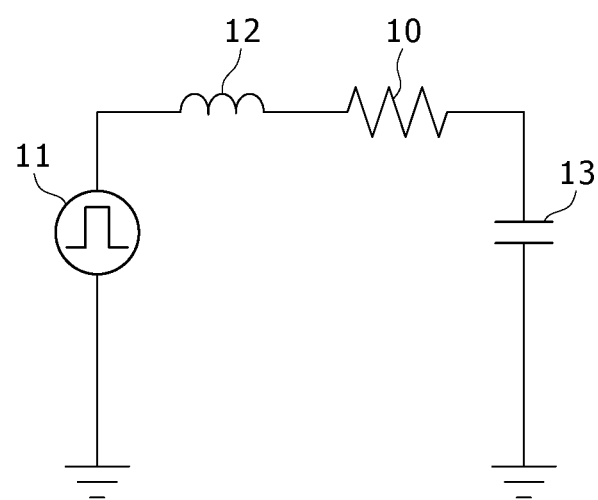
FIG. 9 is a diagram showing the configuration of a storage device of the embodiment of the present disclosure.

FIG. 9 is a circuit diagram of the storage device that generates the above-described undershoot. As shown in FIG. 9, the storage device includes a storage element 10, a power supply circuit 11, a coil 12, and a capacitor 13.

As the storage element 10, the ST-MRAM having the configuration described above with FIG. 1 and FIG. 2 is used. The power supply circuit 11 generates a recording pulse voltage for being applied to the storage element 10. Furthermore, the inductance (coil) 12 for generating undershoot is provided between the power supply circuit 11 and the storage element 10. Moreover, the capacitor 13 is provided with the intermediary of the storage element 10 and thereby an LC circuit is configured.

Figure 10:
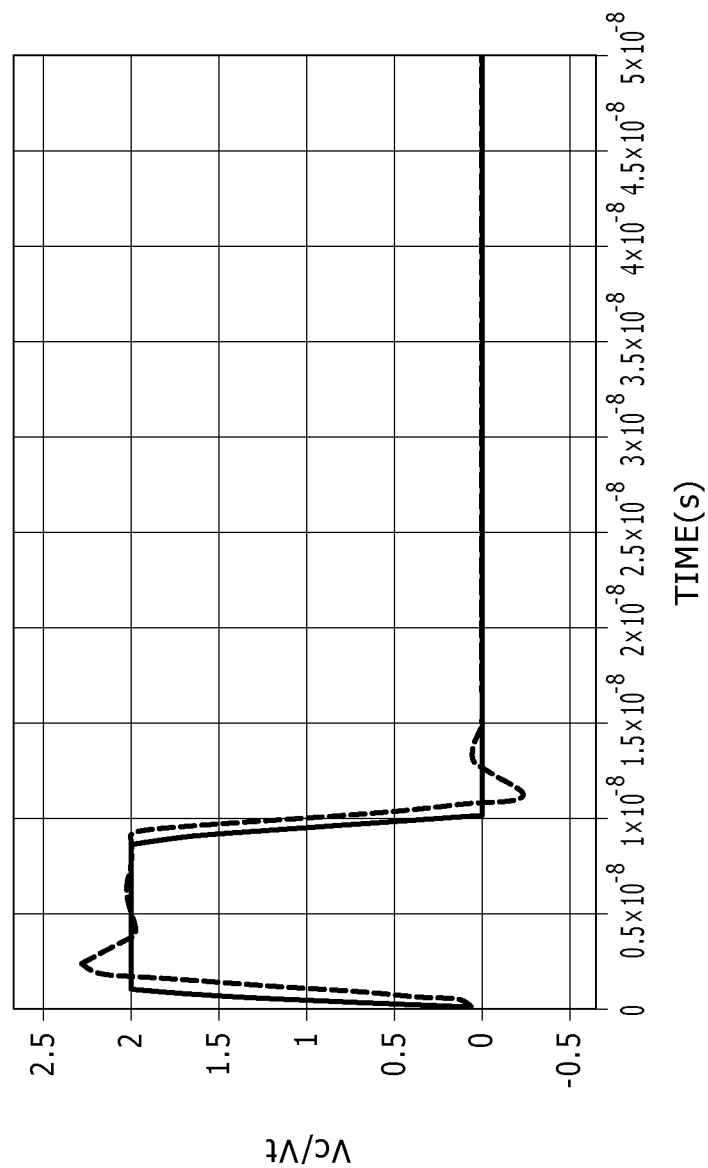
FIG. 10 is a diagram showing one example of the pulse shape of a voltage applied to the storage element in the storage device having the configuration shown in FIG. 9.

FIG. 10 shows one example of the pulse shape of the voltage applied to the storage element 10 by using the circuit shown in FIG. 9. Specifically, FIG. 10 shows a pulse shape when a pulse voltage of 2 V and 10 ns is generated from the power supply circuit 11 by using a coil of 500 nH as the inductance 12 and a capacitor with parasitic capacitance of 350 fF.

In FIG. 10, the dashed line indicates the shape of the pulse generated in the voltage source 11 and the full line indicates the shape of the pulse applied to the storage element 10.

As shown in FIG. 10, ringing occurs because of the provision of the inductance between the power supply circuit 11 and the storage element 10, and undershoot is introduced at the falling edge of the pulse. The above-described device can apply a pulse having such a shape to the storage element.

In the storage device having the above-described circuit, undershoot is introduced in the recording pulse applied to the storage element. Thus, the electrical breakdown of the tunnel insulating film can be easily suppressed without requiring large changes in the MTJ material, the microfabrication process, and so forth. Furthermore, driving the storage device by the circuit having the above-described configuration allows minimization of loss of the recording cycle time due to application of the reverse-polarity pulse.

As another technique to apply the reverse-polarity pulse, for example it is also possible to timely apply a pulse of the different polarity, i.e. apply the reverse-polarity pulse in such a manner as to targeting the pause time zone of the recording pulse, although it is difficult to drive the storage device in practice. In this configuration, the reverse-polarity pulse (undershoot) can be applied by adjusting the timing in consideration of e.g. variation in the transmission time in the chip due to interconnect delay in advance.

The above-described embodiment relates to an example of application to an ST-MRAM including a storage layer and a pinned layer having magnetization directions parallel to the film surface. However, the embodiment can be applied also to an ST-MRAM of another form similarly. For example, as shown in FIG. 11, the embodiment can be applied also to an ST-MRAM having magnetization directions perpendicular to the film surface.

Figure 11:
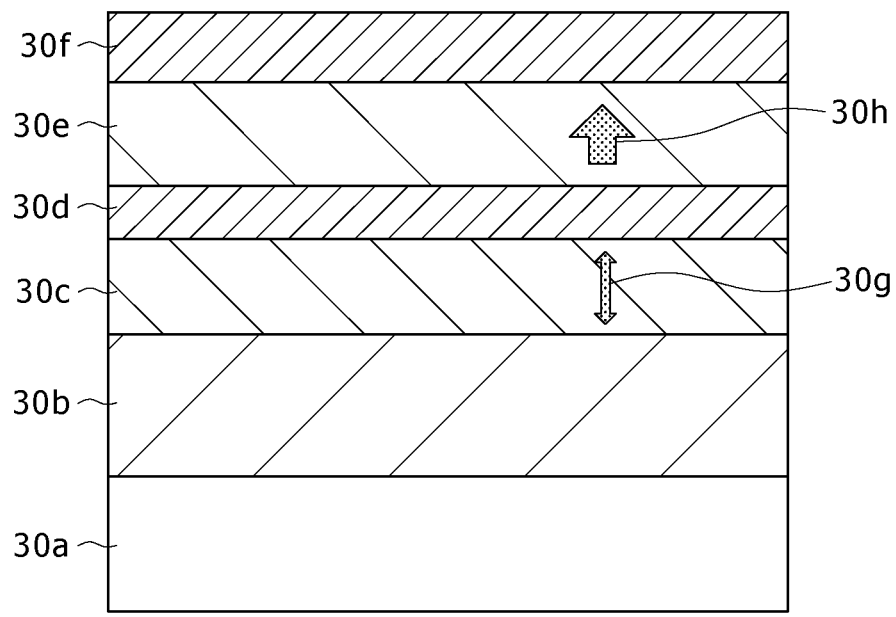
FIG. 11 is a sectional view showing another configuration of the ST-MRAM according to the embodiment of the present disclosure.

An ST-MRAM of a perpendicular magnetization type shown in FIG. 11 is composed of a substrate 30a, a base layer 30b, a storage layer 30c (or magnetization storage layer or free layer), a non-magnetic layer (tunnel barrier layer) 30d, a pinned layer (magnetization pinned layer) 30e, and a protective layer 30f.

The storage layer 30c is formed of a ferromagnetic body having a magnetic moment 30g whose magnetization direction freely changes to a direction perpendicular to the film surface. The magnetization pinned layer 30e is formed of a ferromagnetic body having a magnetic moment 30h whose magnetization direction is a fixed direction perpendicular to the film surface.

Information is stored based on the orientation of the magnetic moment 30g of the storage layer 30c having uniaxial anisotropy. Writing is performed by applying a current in a direction perpendicular to the film surface to thereby cause spin torque magnetization reversal.

Figure 12:
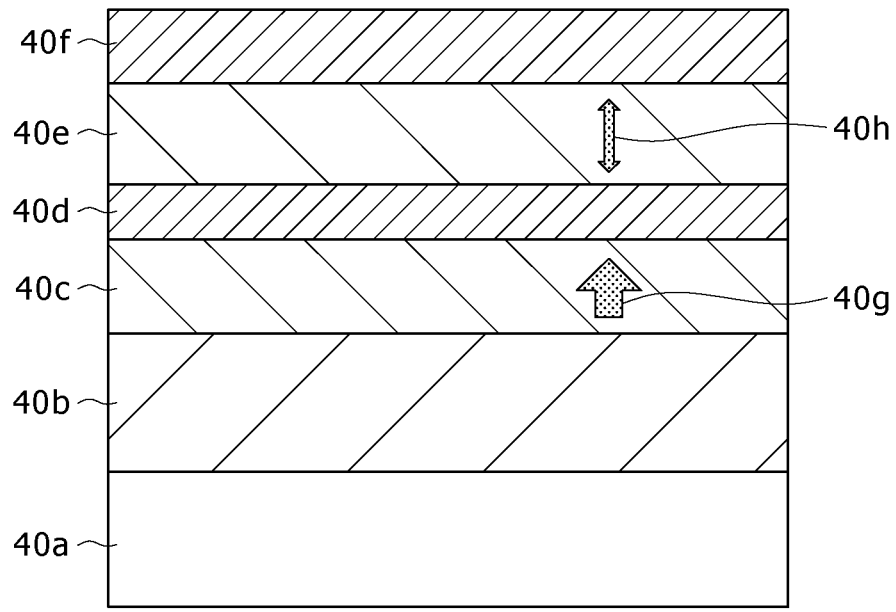
FIG. 12 is a sectional view showing another configuration of the ST-MRAM according to the embodiment of the present disclosure.

Furthermore, as shown in FIG. 12, it is also possible to apply an ST-MRAM configured with change of the positions of the storage layer and the pinned layer to the above-described embodiment.

An ST-MRAM of a perpendicular magnetization type shown in FIG. 12 is composed of a substrate 40a, a base layer 40b, a pinned layer (magnetization pinned layer) 40c, a non-magnetic layer (tunnel barrier layer) 40d, a storage layer 40e (or magnetization storage layer or free layer), and a protective layer 40f.

The storage layer 40e is formed of a ferromagnetic body having a magnetic moment 40h whose magnetization direction freely changes to a direction perpendicular to the film surface. The magnetization pinned layer 40c is formed of a ferromagnetic body having a magnetic moment 40g whose magnetization direction is a fixed direction perpendicular to the film surface.

Information is stored based on the orientation of the magnetic moment 40h of the storage layer 40e having uniaxial anisotropy. Writing is performed by applying a current in a direction perpendicular to the film surface to thereby cause spin torque magnetization reversal.

Also in the above-described ST-MRAM having magnetization perpendicular to the film surface, through control of the method of application of the recording voltage, the dielectric breakdown of the tunnel barrier can be suppressed by introducing undershoot at the falling edge of the pulse voltage in recording for example. As a result, the possibility of the occurrence of electrical breakdown can be decreased in the storage element.

The present disclosure is not limited to the configuration described in the above-described embodiment and other various modifications and changes can be made without departing from the configuration of the present disclosure.

The present application contains subject matter related to that disclosed in Japanese Priority Patent Application JP 2010-139371 filed in the Japan Patent Office on Jun. 18, 2010, the entire content of which is hereby incorporated by reference.

What is claimed is:

1. A method for driving a storage element that has a plurality of magnetic layers and performs recording by utilizing spin torque magnetization reversal, the method comprising:
    applying a first pulse voltage for writing information in the storage element; and
    applying a second pulse voltage having a reverse polarity with respect to a polarity of the first pulse voltage,
    wherein the second pulse voltage has an absolute value less than an absolute value of the first pulse voltage by a predetermined value to prevent writing in a direction opposite to a direction of the information written by the first pulse voltage.

2. The method according to claim 1, further comprising undershooting the second pulse voltage at a falling edge of the first pulse voltage.

3. The method according to claim 2, wherein an absolute value of the undershoot is in a range from 5% to 20% of the absolute value of the first pulse voltage and a pulse width of the undershoot is in a range from 5% to 20% of a pulse width of the first pulse voltage.

4. The method according to claim 1, wherein the second pulse voltage occurs at a falling edge of the first pulse voltage.

5. The method according to claim 1, wherein the second pulse voltage is not used for writing information.

6. The method according to claim 1, wherein the second pulse voltage is applied in such a manner as to target a pause time zone of the first pulse voltage.

7. The method according to claim 1, wherein restoration of a defect generated in the storage element due to application of the first pulse voltage is accelerated after the application of the second pulse voltage.

8. The method according to claim 1, wherein an electrical breakdown of the storage element is suppressed on the application of the second pulse voltage.

9. A storage device comprising:
    a storage element configured to have a storage layer and a pinned layer with a tunnel barrier layer between the storage layer and the pinned layer;
    a power supply circuit configured to apply pulse voltages to the storage element; and
    an inductance in series between the storage element and the power supply circuit,
    wherein the inductance is effective to cause the pulse voltages supplied by the power supply to be undershot, and
    wherein the undershoot is used to restore a defect generated in the storage element while writing information to the storage element using the pulse voltages.

10. The storage device of claim 9, wherein the power supply is configured to apply a first pulse voltage for writing information in the storage element; and
    apply a second pulse voltage having a reverse polarity with respect to a polarity of the first pulse voltage,
    wherein the second pulse voltage has an absolute value less than an absolute value of the first pulse voltage to prevent writing in a direction opposite to a direction of the information written by the first pulse voltage.

11. The storage device of claim 9, wherein an absolute value of the undershoot is in a range from 5% to 20% of an absolute value of one of the pulse voltages and a pulse width of the undershoot is in a range from 5% to 20% of pulse width of the one of the pulse voltages.

12. The storage device of claim 9, wherein the undershoot is introduced by a reverse polarity pulse.

13. A method for driving a storage element that has a plurality of magnetic layers and performs recording by utilizing spin torque magnetization reversal, the method comprising:
    applying a first pulse voltage and writing information on the storage element; and
    applying a second pulse voltage having a reverse polarity with respect to a polarity of the first pulse voltage,
    wherein the second pulse voltage is applied to suppress electrical breakdown of the storage element.

* * * * *